(12) United States Patent
Koseki et al.

(10) Patent No.: US 9,018,659 B2
(45) Date of Patent: Apr. 28, 2015

(54) SEALING MATERIAL FOR LIGHT-EMITTING DEVICE HAVING GAS BARRIER PROPERTY

(71) Applicant: Toyoda Gosei Co., Ltd., Kiyosu-shi, Aichi-ken (JP)

(72) Inventors: Masakata Koseki, Kiyosu (JP); Makoto Sato, Kiyosu (JP); Tomoko Suzuki, Kiyosu (JP); Takeshi Matsushima, Kiyosu (JP); Hiroyuki Tajima, Kiyosu (JP); Yuichi Yano, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 232 days.

(21) Appl. No.: 13/717,435

(22) Filed: Dec. 17, 2012

(65) Prior Publication Data

US 2013/0207152 A1   Aug. 15, 2013

(30) Foreign Application Priority Data

Feb. 10, 2012 (JP) ................... 2012-027062

(51) Int. Cl.
*H01L 33/00* (2010.01)
*H01L 33/62* (2010.01)
*H01L 33/56* (2010.01)

(52) U.S. Cl.
CPC ............... *H01L 33/62* (2013.01); *H01L 33/56* (2013.01); *H01L 2224/48091* (2013.01)

(58) Field of Classification Search
None
See application file for complete search history.

(56) References Cited

U.S. PATENT DOCUMENTS 7,859,006 B2   12/2010   Kato et al.
8,174,043 B2   5/2012   Ito

FOREIGN PATENT DOCUMENTS

JP   2009-081430 A   4/2009

*Primary Examiner* — Hoang-Quan Ho
(74) *Attorney, Agent, or Firm* — McGinn IP Law Group, PLLC

(57) ABSTRACT

A light-emitting device includes a light-emitting element mounted on a lead frame, and a sealing material sealing the light-emitting element and having a thickness of not more than 1 mm and including a silicone resin as a main component. The sealing material includes a first gas barrier layer that a physical property value obtained by dividing a difference between a value of an average spin-spin relaxation time of $^1$H nuclei at a resonance frequency of 25 MHz at 140° C. and that at 25° C. by 115 is not more than 3.5 and the average spin-spin relaxation time at 140° C. is not more than 500 μsec.

9 Claims, 3 Drawing Sheets

SEALING MATERIAL FOR LIGHT-EMITTING DEVICE HAVING GAS BARRIER PROPERTY

The present application is based on Japanese patent application No. 2012-027062 filed on Feb. 10, 2012, the entire contents of which are incorporated herein by reference.

BACKGROUND OF THE INVENTION

1. Field of the Invention

The invention relates to a light-emitting device.

2. Related Art

A conventional light-emitting device is known that a silicone resin excellent in gas-barrier property is used as a sealing material for sealing a light-emitting element (see, e.g., JP-A-2009-81430).

According to JP-A-2009-81430, use of the sealing material excellent in gas-barrier property prevents sulfur-based gas or chlorine-based gas from entering into the device and it is thus possible to prevent discoloration caused by corrosion from occurring on a lead frame to which the light-emitting element is connected. A decrease in emission intensity of the light-emitting device caused by a decrease in reflectivity of the lead frame can be prevented by preventing the discoloration of the lead frame.

In JP-A-2009-81430, the crosslink density of the silicone resin was examined by measuring an average spin-spin relaxation time of $^1$H nuclei using pulse NMR and the gas-barrier property was evaluated. The shorter the average spin-spin relaxation time of $^1$H nuclei is, the higher the crosslink density is and the more excellent the gas-barrier property is.

SUMMARY OF THE INVENTION

In recent years, due to the low-profile light-emitting device, heat from the light-emitting element is likely to be transferred to the entire sealing material and therefore the temperature of the sealing material may rise during the operation of the light-emitting element. In addition, the light-emitting device may be used in a wide temperature range depending on the intended use. For example, a light-emitting device with a dimming function may be subjected to a change in the internal temperature of the light-emitting device caused by a change in amount of electric current flowing through the light-emitting element due to the dimming.

The gas-barrier property of the silicone resin used for the sealing material generally decreases with an increase in the temperature.

Accordingly, it is an object of the invention to provide a light-emitting device that has a sealing material that can prevent the discoloration of the lead film (i.e., the decrease in the gas-barrier property) in the wide temperature range even when it is low-profile.

(1) According to one embodiment of the invention, a light-emitting device comprises:

a light-emitting element mounted on a lead frame; and a sealing material sealing the light-emitting element and having a thickness of not more than 1 mm and comprising a silicone resin as a main component, wherein the sealing material comprises a first gas barrier layer that a physical property value obtained by dividing a difference between a value of an average spin-spin relaxation time of 1 H nuclei at a resonance frequency of 25 MHz at 140° C. and that at 25° C. by 115 is not more than 3.5 and the average spin-spin relaxation time at 140° C. is not more than 500 μsec.

In the above embodiment (1) of the invention, the following modifications and changes can be made.

(i) The sealing material has a thickness of not more than 0.6 mm.

(ii) The sealing material further comprises a second gas barrier layer, wherein the average spin-spin relaxation time of the second gas barrier layer is less than that of the first gas barrier layer in a first temperature range including 25° C. and is more than that of the first gas barrier layer in a second temperature range including 140° C.

(iii) The first temperature range comprises a temperature range of not less than 25° C. and not more than 60° C., and the second temperature range comprises a temperature range of not less than 120° C. and not more than 140° C.

(iv) The physical property value of the second gas barrier layer is more than 3.5.

(v) The light-emitting element is connected to the lead frame via a wire, wherein an entirety of the wire is encompassed in a lower one of the first gas barrier layer and the second gas barrier layer.

(vi) The physical property value of the first gas barrier layer is not more than 3.0 and the physical property value of the second gas barrier layer is more than 4.9.

Points of the Invention

According to one embodiment of the invention, a light-emitting device is constructed such that a sealing material thereof has a first gas barrier layer that a physical property value α obtained by dividing a difference between a value of an average spin-spin relaxation time of 1 H nuclei at a resonance frequency of 25 MHz at 140° C. and that at 25° C. by 115 is not more than 3.5 and the average spin-spin relaxation time at 140° C. is not more than 500 μsec. The smaller the value α is, the smaller the increment of the average spin-spin relaxation time of 1 H nuclei according to the temperature rise is. In other words, a reduction in the gas-barrier property according to the temperature rise can be suppressed.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Figure 1:
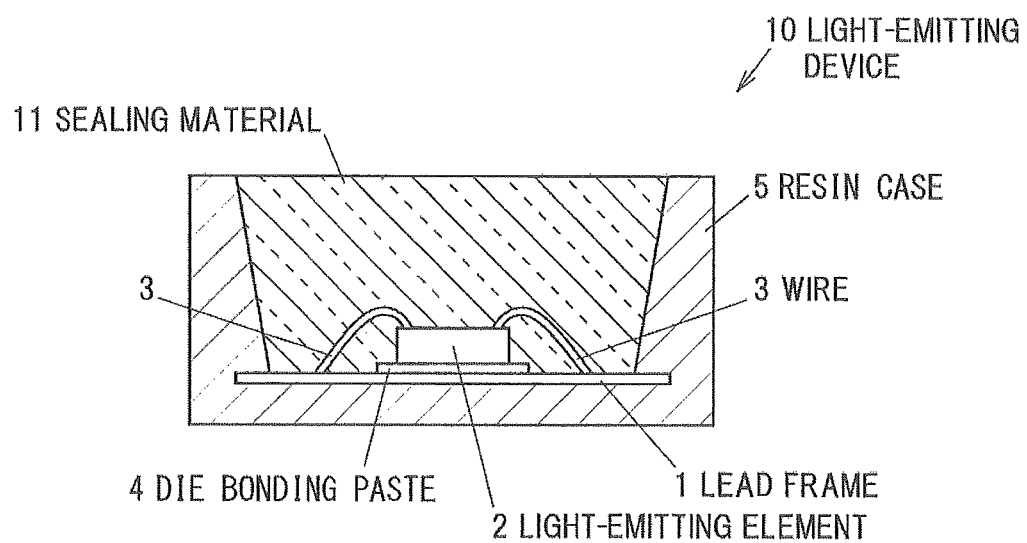
FIG. 1 is a vertical cross-sectional view showing a light-emitting device in a first embodiment.

FIG. 1 is a vertical cross-sectional view showing a light-emitting device in a first embodiment. A light-emitting device 10 has a light-emitting element 2 mounted on a lead frame 1 and a sealing material 11 for sealing the light-emitting element 2. The lead frame 1, the light-emitting element 2 and the sealing material 11 are formed inside a resin case 5.

The light-emitting element 2 is, e.g., an LED chip, etc. Non-illustrated n- and p-electrodes of the light-emitting element 2 are connected to the lead frame 1 via wires 3 (wire bonding). In addition, the light-emitting element 2 is fixed to the lead frame 1 by a die bonding paste 4.

The light-emitting device 10 shown in FIG. 1 is a surface mount device using a face-up type LED chip as the light-emitting element 2, but may have other structures such as a side-view type, a bullet-type or a COB (Chip on Board) type. The light-emitting element 2 is not limited to the face-up type, and may be a flip-chip type.

For example, the entire portion of the entire lead frame 1 or the surface thereof is formed of Ag, Cu and Al. Ag, Cu and Al have excellent conductivity, but are likely to be corroded and discolored by exposure to gas in the air, such as sulfur-based gas or chlorine-based gas. If the lead frame 1 is discolored, reflectivity thereof decreases and emission intensity of the light-emitting device 10 thus decreases. Especially Ag has high reflectivity and is excellent as a material used for the lead frame 1, but has a disadvantage in that discoloration due to corrosion is especially likely to occur. Therefore, the present embodiment in which discoloration of the lead frame 1 due to corrosion can be suppressed is effective especially when Ag is used as a material of the lead frame 1.

The sealing material 11 consists mainly of a silicone resin having excellent gas-barrier property in a wide temperature range and suppresses discoloration of the lead frame 1. The silicone resin constituting the sealing material 11 preferably contains "—O—Si—O—Si—O—" bond as a main backbone in which yellowing due to heat or light is less likely to occur. The sealing material 11 may contain a phosphor. The sealing material 11 may further contain a dispersant which disperses the phosphor. The phosphor may be contained in a dispersed state or in a settled state.

In addition, the sealing material 11 may contain a filler. The content of filler is not specifically limited. The filler preferably has excellent heat resistance in view of the manufacturing conditions and performance of the light-emitting device 10, and preferably allows the use under the temperature condition of, e.g., not less than 150° C. The sealing material 11 may be either an ultraviolet curable-type or a thermosetting type.

A material in which yellowing due to heat or light is less likely to occur is preferable as a material of the filler. The sealing material 11 may contain a transparent filler such as silica, silicone, glass beads and glass fiber, etc., or a white filler such as titanium oxide and potassium titanate, etc. The shape of the filler is not limited and is, e.g., granular shape, spherical shape, scale shape, rod shape or fibrous shape.

In the sealing material 11, a physical property value obtained by dividing a difference between a value of an average spin-spin relaxation time of $^1H$ nuclei at a resonance frequency of 25 MHz at 140° C. and that at 25° C. by 115 is preferably not more than 3.5, and more preferably not more than 3.0, as described later. In addition, the average spin-spin relaxation time of $^1H$ nuclei at a resonance frequency of 25 MHz at 140° C. is not more than 500 μsec, and preferably not more than 450 μsec. Due to these characteristics, the sealing material 11 has excellent gas-barrier property in a wide temperature range.

In addition, the thickness (i.e., thickness in a direction orthogonal to the surface of the lead frame 1) of the sealing material 11 is not more than 1 mm, and preferably not more than 0.6 mm. Since the sealing material 11 has excellent gas-barrier property, it is possible to effectively suppress the discoloration of the lead frame 1 even if the sealing material 11 is low-profile. In addition, since it is possible to reduce the thickness of the sealing material 11, it is possible to make the light-emitting device 10 thinner.

It is possible to evaluate the gas-barrier property of the sealing material 11 by measuring the spin-spin relaxation time of $^1H$ nuclei using a pulse NMR method. In detail, a sample of liquid or solid silicone resin is placed in a strong magnetic field and is subjected to an electromagnetic wave pulse, and a response signal against the electromagnetic wave pulse is detected by a coil, thereby measuring the spin-spin relaxation time of $^1H$ nuclei.

The average spin-spin relaxation time of $^1H$ nuclei is an average value of the spin-spin relaxation times of plural $^1H$ nuclei in a molecule of the silicone resin. The shorter the average spin-spin relaxation time of $^1H$ nuclei, the higher the crosslink density and the more excellent the gas-barrier property.

Figure 2:
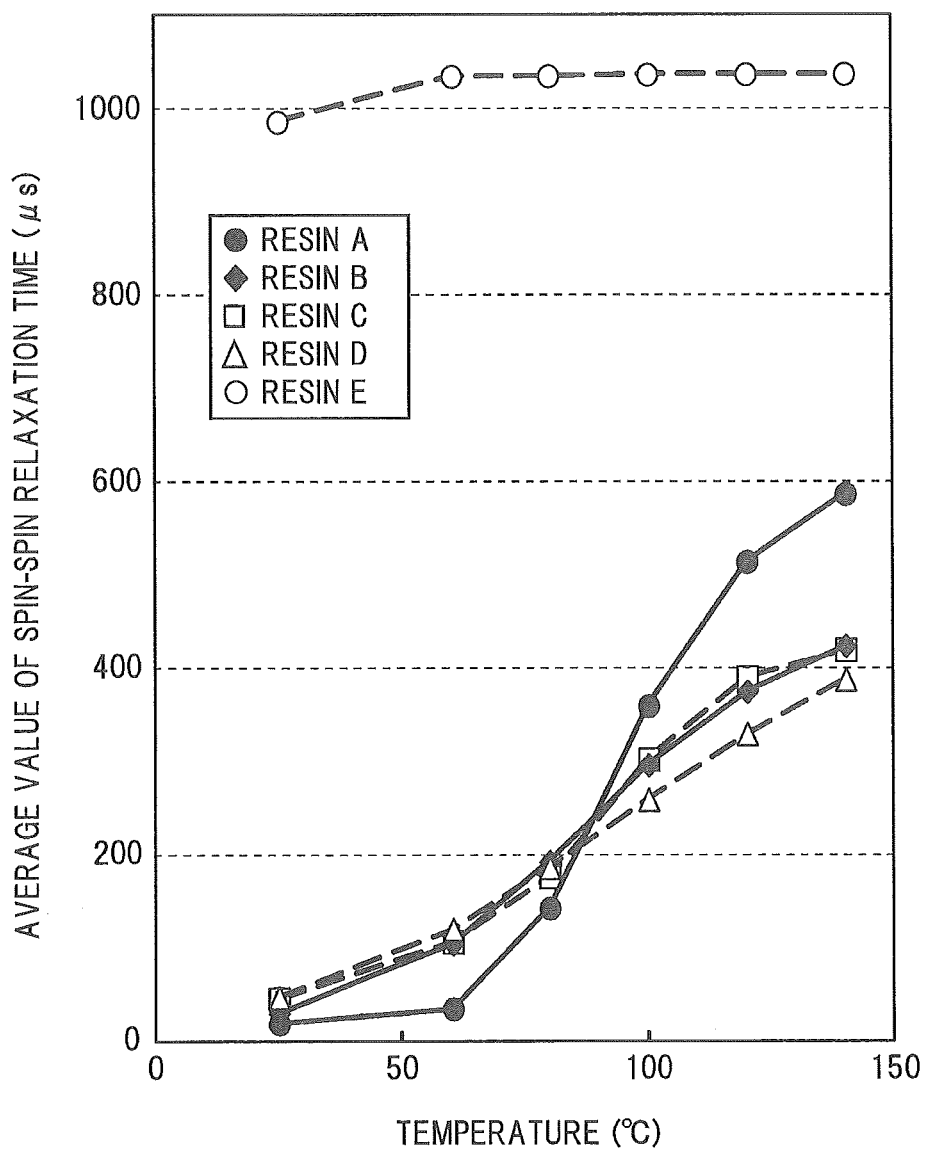
FIG. 2 is a graph showing temperature dependence of an average spin-spin relaxation time of $^1$H nuclei measured on five different silicone resins, which are resins A, B, C, D and E.

FIG. 2 is a graph showing temperature dependence of an average spin-spin relaxation time of $^1H$ nuclei measured on five different silicone resins, which are resins A, B, C, D and E. In FIG. 2, measured values of the resins A, B, C, D and E are respectively indicated by symbols ● (filled circle), ◇ (open diamond), □ (open square), ▲ (filled triangle) and ○ (open circle). Here, the resin A is a modified phenyl silicone resin, the resins B, C and D are a phenyl silicone resin and the resin E is a dimethyl silicone resin.

The followings are the conditions for measuring the spin-spin relaxation time of the resins A, B, C, D and E.
Measurement apparatus: MU25, manufactured by JEOL Ltd.
Resonance frequency: 25 MHz
Measuring temperature: 25 to 140° C.
Observed nuclear species: $^1H$
Magnet: permanent magnet 0.58 T
Detecting method: QD (Quadrature Detection) method
Pulse sequence: solid-echo method
RF pulse width: 2 microseconds
Pulse interval: 8 microseconds
Pulse repetition time: 1 sec The average spin-spin relaxation time of $^1H$ nuclei increases with temperature rise in all silicone resins, but length of the average spin-spin relaxation time of $^1H$ nuclei may be reversed in different silicone resins depending on a temperature range.

For example, the average spin-spin relaxation time of $^1H$ nuclei of the resin A is shorter than those of the resins B, C and D in the temperature range of 25 to 80° C., but is longer in the temperature range of 100 to 140° C. This shows that the resin A has better gas-barrier property than the resins B, C and D in the temperature range of 25 to 80° C. while the resins B, C and D have better gas-barrier property than the resin A in the temperature range of 100 to 140° C.

An inclination of a line segment connecting a measurement point of the average spin-spin relaxation time of $^1H$ nuclei at 25° C. to that at 140° C. in FIG. 2, i.e., a physical property value (hereinafter, denoted as "α") obtained by dividing a difference between a value of the average spin-spin relaxation time of $^1H$ nuclei at 140° C. and that at 25° C. by 115 as a difference value between 25° C. and 140° C. will be examined below.

The value "α" of the resins A, B, C and D is 4.94, 3.43, 3.25 and 2.96, respectively. The smaller the value α is, the smaller the increment of the average spin-spin relaxation time of $^1H$ nuclei according to the temperature rise is. In other words, a reduction in the gas-barrier property according to the temperature rise can be suppressed.

For example, the resin A with a value α more than that of resins B, C or D has a gas-barrier property better than the resins B, C and D in the temperature range of 25° C., closer to room temperature, to 80° C., but the gas-barrier property of the resin A greatly decreases and becomes poorer than those of the resins B, C and D in the higher temperature range of 100 to 140° C. Therefore, in the light-emitting device 10 which is used in a wide temperature range, it is preferable to use the resins B, C and D having small α as a material of the sealing material 11.

Evaluation of the Sealing Material

The inventors formed the light-emitting devices 10 using the resins A to D as the sealing material 11 and evaluated brightness maintenance factor after exposing to a sulfur gas atmosphere. The more significant the discoloration of the lead frame 1 is, the lower the reflectivity and the brightness maintenance factor are. Here, a sample of which brightness after the exposure is not less than 50% of prior to exposure is regarded as passed the test and less than 50% is regarded as failed.

Followings are conditions for evaluating the sealing material.
Thickness of Sealing material: 0.6 mm
Temperature: 100° C.
Concentration of Sulfur gas: 3 to 5 ppm
Exposure time: 200 hours As a result of the evaluation, the resins B, C and D passed the test and the resin A failed. This result is consistent with the content of FIG. 2 in which the resin A has the longest average spin-spin relaxation time of $^1$H nuclei at 100° C.

Considering the result of the evaluation, the value α of the sealing material 11 is preferably not more than 3.5 which includes the values of the resins B, C and D, and more preferably not more than 3.0 which includes only the value of the resin B having the minimum value α.

Meanwhile, the sealing material, which is formed using the resin A so as to have a thickness of 1.5 mm which is thicker than the above-mentioned evaluation condition, passed the evaluation. This is because it is possible to suppress entrance of the sulfur gas by thickening the sealing material even though the resin has poor gas-barrier property. However, thickening the sealing material has a disadvantage in that the light-emitting device is also thickened.

In the meantime, the resin E shown in FIG. 2 has significantly poor gas-barrier property but has a very small value α which is 0.45. This is because the length of the average spin-spin relaxation time of $^1$H nuclei is saturated in the silicone resin having significantly poor gas-barrier property and temperature dependence decreases.

Therefore, it is preferable that the resin used for the sealing material 11 satisfy not only the conditions for α but also the conditions for the length of the average spin-spin relaxation time of $^1$H nuclei. For example, it is preferable to satisfy the conditions for the average spin-spin relaxation time of $^1$H nuclei which are satisfied by the resins B, C and D having excellent gas-barrier property but are not satisfied by the resins A and E, i.e., not more than 500 μsec of the average spin-spin relaxation time of $^1$H nuclei at 140° C.

Effects of the First Embodiment

In the first embodiment, since the sealing material 11 is thin but has excellent gas-barrier property in a wide temperature range, it is possible to suppress entrance of gas causing corrosion of metal such as sulfur-based gas or chlorine-based gas into the light-emitting device 10 and it is thus possible to suppress discoloration of the lead frame 1. Therefore, the light-emitting device 10 is thin and has excellent resistance against corrosive gas. In addition, it is possible to use the light-emitting device 10 as a light-emitting device used in a wide temperature range, such as a lighting system having a dimming function.

Second Embodiment

The second embodiment is different from the first embodiment in that the sealing material has a two-layer structure. It should be noted that explanations for the same features as the first embodiment will be omitted or simplified.

Figure 3:
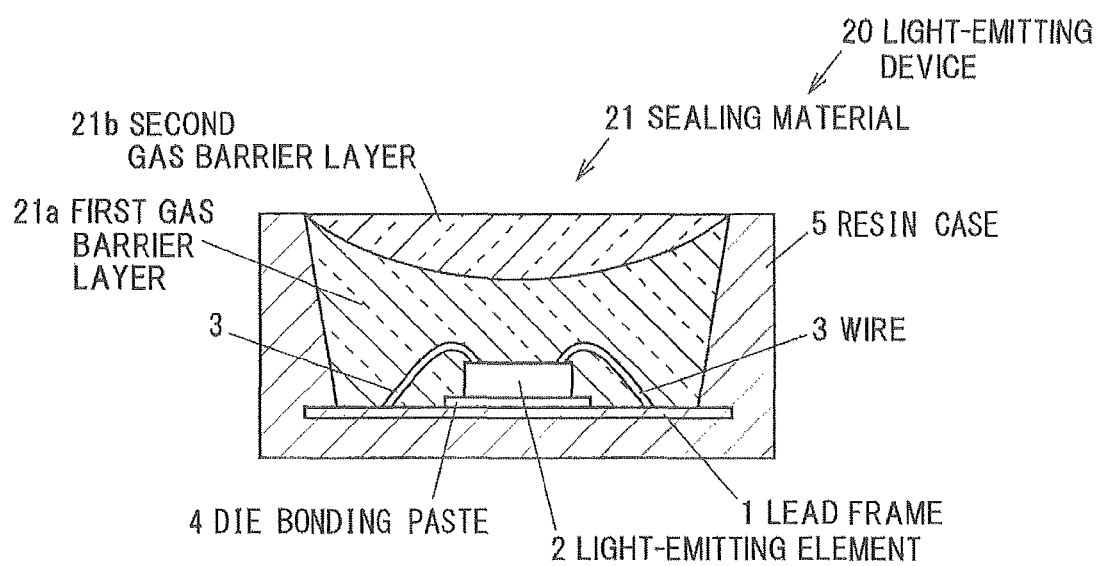
FIG. 3 is a vertical cross-sectional view showing a light-emitting device in a second embodiment.

FIG. 3 is a vertical cross-sectional view showing a light-emitting device in a second embodiment. A light-emitting device 20 has the light-emitting element 2 mounted on a lead frame 1 and a sealing material 21 for sealing the light-emitting element 2. The lead frame 1, the light-emitting element 2 and the sealing material 21 are formed inside the resin case 5.

The sealing material 21 has a two-layer structure composed of a first gas barrier layer 21a and a second gas barrier layer 21b thereon. The first gas barrier layer 21a is formed of the same material as and has the same characteristics as the sealing material 11 in the first embodiment.

The average spin-spin relaxation time of $^1$H nuclei at a resonance frequency of 25 MHz of the second gas barrier layer 21b is smaller than that of the first gas barrier layer 21a in a first temperature range including 25° C. and is larger than that of the first gas barrier layer 21a in a second temperature range including 140° C. In other words, the second gas barrier layer 21b has better gas-barrier property than the first gas barrier layer 21a in the first temperature range and poorer gas-barrier property in the second temperature range. Here, the first and second temperature ranges are respectively, e.g., a range of not less than 25° C. and not more than 60° C. and a range of not less than 120° C. and not more than 140° C.

For example, when the resin B, C or D in FIG. 2 is used for the first gas barrier layer 21a, it is possible to use the resin A for the second gas barrier layer 21b. The average spin-spin relaxation time of $^1$H nuclei at a resonance frequency of 25 MHz of the resin A is shorter than those of the resins B, C and D at least in a range of not less than 25° C. and not more than 60° C. and is longer at least in a range of not less than 120° C. and not more than 140° C.

Meanwhile, the value α of the second gas barrier layer 21b, which is a physical property value obtained by dividing a difference between a value of the average spin-spin relaxation time of $^1$H nuclei at 140° C. and that at 25° C. by 115 as a value of a difference between 25° C. and 140° C., is preferably larger than that of the first gas barrier layer 21a, i.e., more than 3.5. Since the value α of the resin A is 4.94, it is more preferable that the value α of the second gas barrier layer 21b be more than 4.9.

That is, since the sealing material 21 has the second gas barrier layer 21b exhibiting excellent gas-barrier property in a temperature range close to ambient temperature and the first gas barrier layer 21a exhibiting excellent gas-barrier property in a high temperature range, it is possible to effectively suppress discoloration of the lead frame 1 in a wide temperature range. Note that, the material used for the first gas barrier layer 21a and that used for the second gas barrier layer 21b may be reversed. In other words, the gas-barrier property of the first gas barrier layer 21a and those of the second gas barrier layer 21b may be reversed.

Meanwhile, the sealing material 21 has a thickness of not more than 1 mm. Since the sealing material 21 has excellent gas-barrier property, it is possible to suppress discoloration of the lead frame 1 even though the thickness of the sealing material 21 is not more than 1 mm. In addition, since it is possible to reduce the thickness of the sealing material 21, it is possible to make the light-emitting device 20 thinner. The thickness of the first gas barrier layer 21a and that of the second gas barrier layer 21b are not specifically limited and can be appropriately adjusted in accordance with, e.g., temperature of an environment in which the light-emitting device 20 is used.

When forming the sealing material 21, a resin for forming an upper layer of the first gas barrier layer 21a and the second gas barrier layer 21b is injected in a state that the resin for forming a lower layer is not completely cured, and both resins are then cured to allow adhesion between the first gas barrier layer 21a and the second gas barrier layer 21b to be enhanced.

It is preferable that the wire 3 be not in contact with an interface between the first gas barrier layer 21a and the second gas barrier layer 21b. In other words, it is preferable that the entire wire 3 is encompassed in a lower layer of the first gas barrier layer 21a and the second gas barrier layer 21b. This is because the wire may be damaged by stress generated at the interface between the first gas barrier layer 21a and the second gas barrier layer 21b if the wire is in contact with the interface.

In addition to generally often used Au, it is also possible to use Ag as a material of the wire 3. Ag has high reflectivity but has a disadvantage of being corroded or discolored due to sulfur-based gas, etc. However, since the sealing material 21 has excellent gas-barrier property, it is possible to suppress discoloration due to corrosion of the wire 3 even when Ag is used as a material of the wire 3.

Effects of the Second Embodiment

The sealing material 21 in the second embodiment has the second gas barrier layer 21b exhibiting excellent gas-barrier property in a temperature range close to ambient temperature and the first gas barrier layer 21a exhibiting excellent gas-barrier property in a high temperature range, and thus has better in gas-barrier property than the sealing material 11 in the first embodiment. Therefore, the light-emitting device 20 is thin and has more excellent resistance against corrosive gas. In addition, it is possible to use the light-emitting device 20 as a light-emitting device used in a wide temperature range, such as a lighting system having a dimming function.

It should be noted that the present invention is not intended to be limited to the above-mentioned embodiments, and the various kinds of modifications can be implemented without departing from the gist of the invention. In addition, the components in the embodiments can be arbitrarily combined without departing from the gist of the invention.

In addition, the invention according to claims is not to be limited to the above-mentioned embodiments. Further, please note that all combinations of the features described in the embodiments are not necessary to solve the problem of the invention.

What is claimed is:

1. A light-emitting device, comprising:
a light-emitting element mounted on a lead frame; and
a sealing material sealing the light-emitting element and having a thickness of not more than 1 mm and comprising a silicone resin as a main component,
wherein the sealing material comprises a first gas barrier layer that a physical property value obtained by dividing a difference between a value of an average spin-spin relaxation time of $^1$H nuclei at a resonance frequency of 25 MHz at 140° C. and that at 25° C. by 115 is not more than 3.5 and the average spin-spin relaxation time at 140° C. is not more than 500 sec.

2. The light-emitting device according to claim 1, wherein the sealing material has a thickness of not more than 0.6 mm.

3. The light-emitting device according to claim 1, the sealing material further comprises a second gas barrier layer, and
wherein the average spin-spin relaxation time of the second gas barrier layer is less than that of the first gas barrier layer in a first temperature range including 25° C. and is more than that of the first gas barrier layer in a second temperature range including 140° C.

4. The light-emitting device according to claim 2, the sealing material further comprises a second gas barrier layer, and
wherein the average spin-spin relaxation time of the second gas barrier layer is less than that of the first gas barrier layer in a first temperature range including 25° C. and is more than that of the first gas barrier layer in a second temperature range including 140° C.

5. The light-emitting device according to claim 3, wherein the first temperature range comprises a temperature range of not less than 25° C. and not more than 60° C., and the second temperature range comprises a temperature range of not less than 120° C. and not more than 140° C.

6. The light-emitting device according to claim 3, wherein the first temperature range comprises a temperature range of not less than 25° C. and not more than 60° C., and the second temperature range comprises a temperature range of not less than 120° C. and not more than 140° C.

7. The light-emitting device according to claim 3, wherein a physical property value of the second gas barrier layer is more than 3.5.

8. The light-emitting device according to claim 3, wherein the light-emitting element is connected to the lead frame via a wire, and
wherein an entirety of the wire is encompassed in a lower one of the first gas barrier layer and the second gas barrier layer.

9. The light-emitting device according to claim 3, wherein a physical property value of the first gas barrier layer is not more than 3.0 and a physical property value of the second gas barrier layer is more than 4.9.

* * * * *